(12) United States Patent
Ong

(10) Patent No.: US 8,385,106 B2
(45) Date of Patent: Feb. 26, 2013

(54) METHOD AND SYSTEM FOR PROVIDING A HIERARCHICAL DATA PATH FOR SPIN TRANSFER TORQUE RANDOM ACCESS MEMORY

(75) Inventor: Adrian E. Ong, Pleasanton, CA (US)

(73) Assignee: Grandis, Inc., San Jose, CA (US)

( * ) Notice: Subject to any disclaimer, the term of this patent is extended or adjusted under 35 U.S.C. 154(b) by 711 days.

(21) Appl. No.: 12/565,273

(22) Filed: Sep. 23, 2009

(65) Prior Publication Data

US 2011/0063898 A1 Mar. 17, 2011

Related U.S. Application Data

(60) Provisional application No. 61/241,856, filed on Sep. 11, 2009.

(51) Int. Cl.
*G11C 11/00* (2006.01)
(52) U.S. Cl. .......................... 365/158; 365/171; 365/173
(58) Field of Classification Search .................. 365/158, 365/171, 173
See application file for complete search history.

(56) References Cited

U.S. PATENT DOCUMENTS

| | | | |
|---|---|---|---|
| 6,532,164 | B2 | 3/2003 | Redon et al. |
| 6,611,405 | B1 | 8/2003 | Inomata et al. |
| 7,101,600 | B1 | 9/2006 | Kim |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2003/0227807 | A1 | 12/2003 | Nakamura et al. |
| 2005/0040433 | A1 | 2/2005 | Nozieres et al. |
| 2005/0104101 | A1 | 5/2005 | Sun et al. |
| 2005/0174702 | A1 | 8/2005 | Gill |
| 2007/0285975 | A1* | 12/2007 | Kawahara et al. ............ 365/158 |
| 2009/0161423 | A1* | 6/2009 | Sugibayashi et al. ......... 365/171 |

OTHER PUBLICATIONS

Japanese abstract of publication No. 11-120758, Apr. 30, 1999, Non-volatile Random Access Memory, Eric Maiken.
Albert, et al., "Polarized Current Switching of a CO Thin Film Nanomagnet", American Institute of Physics, 77(23):3809-11 (2000).
Berger, "Emission of spin waves by a magnetic multilayer traversed by a current", Physical Review B, 54(13)9953-58 (1996).
Katine, et al., "Current-Driven Magnetization Reversal and Spin-Wave Excitations in Co/Cu/Co Pillars", Physical Review Letters, 84(14):3149-52 (2000).
Nishimura, et al., "Magnetic tunnel junction device with perpendicular magnetization films for high-density magnetic random access memory", J. of Applied Physics, 90(8):5246-49 (2002).

(Continued)

*Primary Examiner* — VanThu Nguyen
*Assistant Examiner* — Hien Nguyen
(74) *Attorney, Agent, or Firm* — Convergent Law Group LLP

(57) ABSTRACT

A method and system for providing a magnetic memory are described. The method and system include providing memory array tiles (MATs), intermediate circuitry, global bit lines, global word lines, and global circuitry. Each MAT includes magnetic storage cells, bit lines, and word lines. Each of the magnetic storage cells includes at least one magnetic element and at least one selection device. The magnetic element(s) are programmable using write current(s) driven through the magnetic element(s). The bit lines and the word lines correspond to the magnetic storage cells. The intermediate circuitry controls read and write operations within the MATs. Each global bit line corresponds to a first portion of the plurality of MATs. Each global word line corresponds to a second portion of the MATs. The global circuitry selects and drives part of the global bit lines and part of the global word lines for the read and write operations.

20 Claims, 9 Drawing Sheets

OTHER PUBLICATIONS

Slonczewski, Conductance and exchange coupling of two ferromagnets separated by a tunneling barrier, Physical Review B, 39(10):6995-7002 (1989).

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

PCT International Search Report and Written Opinion of the ISA, application No. PCT/US08/64794.

PCT International Search Report and Written Opinion of the ISA, application No. PCT/US08/66369.

PCT International Search Report and Written Opinion of the ISA, application No. PCT/US10/47941.

PCT International Search Report and Written Opinion of the ISA, application No. PCT/US10/59184.

Office Action issued Apr. 2008 for U.S. Appl. No. 11/239,939.

Office Action issued Sep. 2008 for U.S. Appl. No. 11/239,939.

Office Action issued Jan. 2010 for U.S. Appl. No. 12/133,671.

Office Action issued Apr. 2009 for U.S. Appl. No. 12/133,671.

Office Action issued Mar. 2011 for U.S. Appl. No. 12/638,902.

M. Hosomi, et al., "A Novel Nonvolatile Memory with Spin Torque Transfer Magnetization Switching: Spin-RAM", IEDM Tech. Digest, 2005, pp. 459-462.

Jing Li, et al., "Variation-Tolerant Spin-Torque Transfer (STT) MRAM Array for Yield Enhancement", IEEE Custom Integrated Circuits Conference (CICC), 2008, pp. 193-196.

T. Kawahara, et al., "2Mb Spin-Transfer Torque RAM (SPRAM) with Bit-by-Bit Bidirectional Current Write and Parallelizing-Direction Current Read", IEEE International Solid-State Circuits Conference, 2007, pp. 480-481.

T.M. Maffitt, et al., "Design considerations for MRAM", IBM Journal of Research and Development, vol. 50, No. 1, Jan. 2006.

R. Nebashi, et al., "A 90nm 12ns 32Mb 2T1MTJ MRAM", IEEE International Solid-State Circuits Conference, 2009, pp. 462-463.

\* cited by examiner

METHOD AND SYSTEM FOR PROVIDING A HIERARCHICAL DATA PATH FOR SPIN TRANSFER TORQUE RANDOM ACCESS MEMORY

CROSS-REFERENCE TO RELATED APPLICATIONS

This application claims the benefit of provisional Patent Application Ser. No. 61/241,856, filed Sep. 11, 2009, assigned to the assignee of the present application, and incorporated herein by reference.

GOVERNMENT RIGHTS

This invention was made with U.S. Government support under Grant/Contract No. 70NANB7H7012 awarded by the NIST. The U.S. Government retains certain rights in this invention

BACKGROUND OF THE INVENTION

Spin Torque Transfer Magnetic Random Access Memory, STT-RAM, is a second generation MRAM technology that may offer the advantages of the first generation MRAM without the drawbacks of poor scalability and high write current. Conventional STT-RAM is desired to combine the fast read and write speed of SRAM, the capacity and cost benefits of DRAM, and the non-volatility of Flash (zero standby power), coupled with essentially unlimited endurance (for example greater than $10^{15}$ cycle). As described below, STT-RAM uses a bi-directional current to write data. Such write operations may be performed without assistance from magnetic field, heat, or other sources of energy. Consequently, STT-RAM may have the lowest writing energy of emerging memory technologies For example, FIGS. 1-3 depict portions of a conventional spin transfer torque magnetic random access memory (STT-RAM). FIG. 1 depicts a small portion of the STT-RAM 1 including a storage cell 10. FIG. 2 depicts the bit line sensing scheme, while FIG. 3 depicts a common source amplifier 50 used in connection with the memory 1. The conventional STT-RAM 1 utilizes spin transfer as a mechanism for switching the state of the magnetic storage cell. The conventional STT-RAM 1 includes a conventional magnetic storage cell 10 including a magnetic element 12 and a selection device 14. The selection device 14 is generally a transistor such as a NMOS transistor and includes a drain 11, a source 13, and a gate 15. Also depicted are a word line 16, a bit line 18, and source line 20. The word line 16 is oriented perpendicular to the bit line 18. The source line 20 is typically either parallel or perpendicular to the bit line 18, depending on specific architecture used for the conventional STT-RAM 1. The bit line 18 is connected to the magnetic element 12, while the source line 20 is connected to the source 13 of the selection device 14. The word line 16 is connected to the gate 15.

The conventional STT-RAM 1 programs the magnetic memory cell 10 by driving a bi-directional current through the cell 10. In particular, the magnetic element 12 is configured to be changeable between high and low resistance states by a current flowing through the conventional magnetic element 12. For example, the magnetic element 12 may be a magnetic tunneling junction (MTJ) or other magnetic structure that may be written using the spin transfer effect. Typically, this is achieved by ensuring that the magnetic element 12 has, for example, a sufficiently small cross-sectional area as well as other features desirable for switching using the spin transfer effect. When the current density is sufficiently large, the current carriers driven through the magnetic element 12 may impart sufficient torque to change the state of the magnetic element 12. When the write current is driven in one direction, the state may be changed from a low resistance state to a high resistance state. When the write current is passes through the magnetic element 12 in the opposite direction, the state may be changed from a high resistance state to a low resistance state.

During write operations, the word line 16 is high and turns on the selection device 14. The write current flows either from the bit line 18 to the source line 20, or vice versa, depending upon the state to be written to the magnetic memory cell 10. During read operations, the column decoder 22 selects the desired bit lines 18. A row decoder (not shown in FIG. 2 also enables the appropriate word line(s) 16. Thus, the word line 16 is high, enabling the selection device 14. Consequently, a read current flows from the bit line 18 to the source line 20. In addition to the read current ($I_{data}$ in FIG. 2) flowing through the cell being read, reference currents are also driven through reference resistors Rref0 and Rref1. The output signals are provided to a sense amplifier, such as the conventional sense amplifier 50 shown in FIG. 3.

Because the magnetic element 12 is programmed by a current driven through the magnetic element 12, the conventional STT-RAM 1 may have better cell scalability and lower write current without suffering from the problem of write disturbance to the neighboring memory cells and smaller cell size for high memory density.

Although the conventional STT-RAM 1 functions, one of ordinary skill in the art will readily recognize that the STT-RAM 1 is still desired to be improved. More specifically, it is desirable to provide an STT-RAM that is scalable and has sufficiently fast access times to continue development as a next-generation nonvolatile memory.

BRIEF SUMMARY OF THE INVENTION

A method and system for providing a magnetic memory are described. The method and system include providing memory array tiles (MATs), intermediate circuitry, global bit lines, global write lines, and global circuitry. Each MAT includes magnetic storage cells, bit lines, and word lines. Each of the magnetic storage cells includes at least one magnetic element and at least one selection device. The magnetic element(s) are programmable using write current(s) driven through the magnetic element(s). The bit lines and the word lines correspond to the magnetic storage cells. The intermediate circuitry controls read and write operations within the MATs. Each global bit line corresponds to a first portion of the plurality of MATs. Each global write line corresponds to a second portion of the MATs. The global circuitry selects and drives part of the global bit lines and part of the global write lines for the read and write operations.

According to the method and system disclosed herein, the present invention provides a magnetic memory employing a hierarchical architecture, which may result in faster access times and increased write and/or read margins.

DETAILED DESCRIPTION OF THE INVENTION

The present invention relates to magnetic memories. The following description is presented to enable one of ordinary skill in the art to make and use the invention and is provided in the context of a patent application and its requirements. Various modifications to the preferred embodiments and the generic principles and features described herein will be readily apparent to those skilled in the art. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein. Further, for clarity, the drawings are not to scale A method and system for providing a magnetic memory are described. The method and system include providing memory array tiles (MATs), intermediate circuitry, global bit lines, global write lines, and global circuitry. Each MAT includes magnetic storage cells, bit lines, and word lines. Each of the magnetic storage cells includes at least one magnetic element and at least one selection device. The magnetic element(s) are programmable using write current(s) driven through the magnetic element(s). The bit lines and the word lines correspond to the magnetic storage cells. The intermediate circuitry controls read and write operations within the MATs. Each global bit line corresponds to a first portion of the plurality of MATs. Each global write line corresponds to a second portion of the MATs. The global circuitry selects and drives part of the global bit lines and part of the global write lines for the read and write operations.

Figure 1:
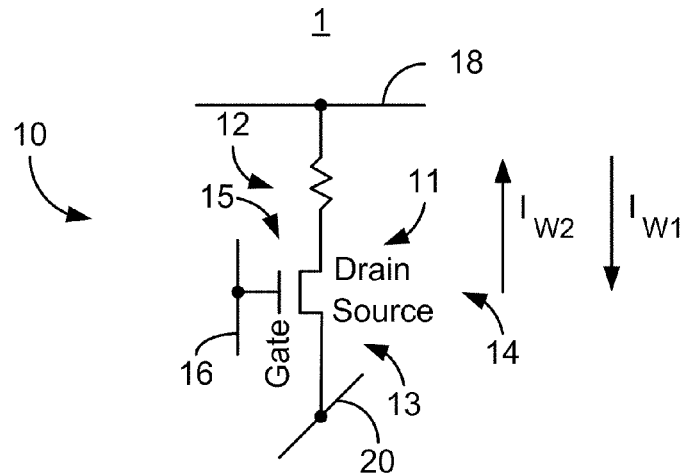
FIG. 1 is a diagram of a portion of a conventional magnetic memory employing the spin transfer effect.
Figure 2:
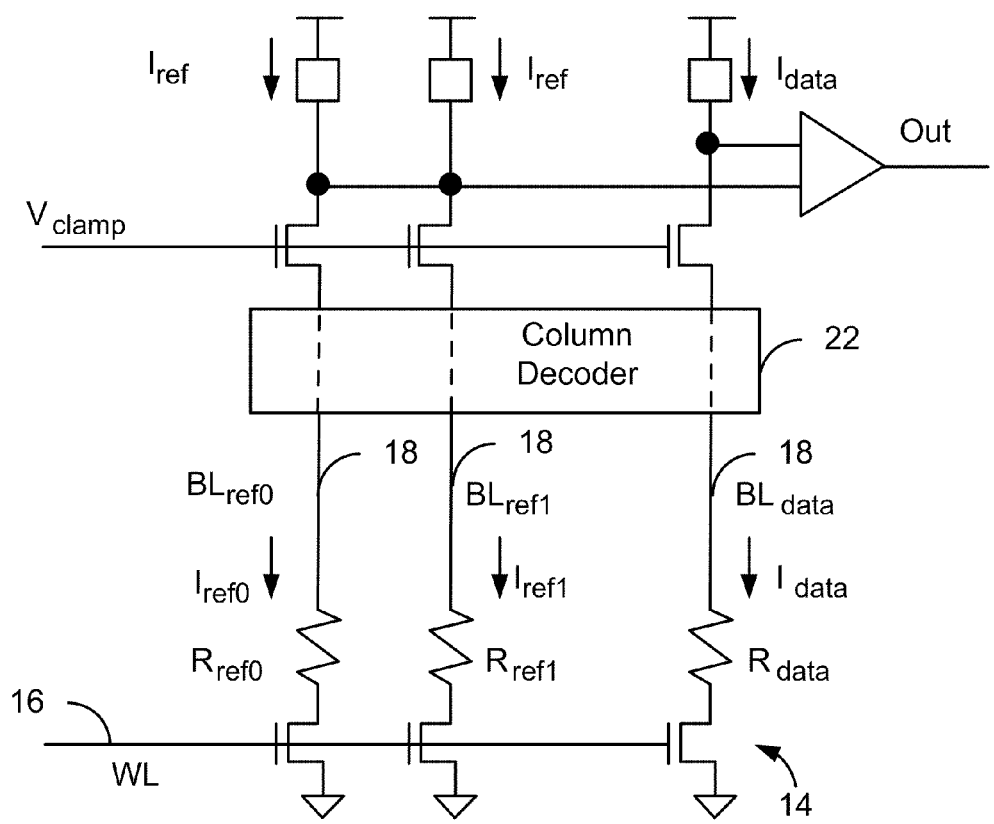
FIG. 2 is a diagram of a portion of a magnetic memory array employing the spin transfer effect.
Figure 3:
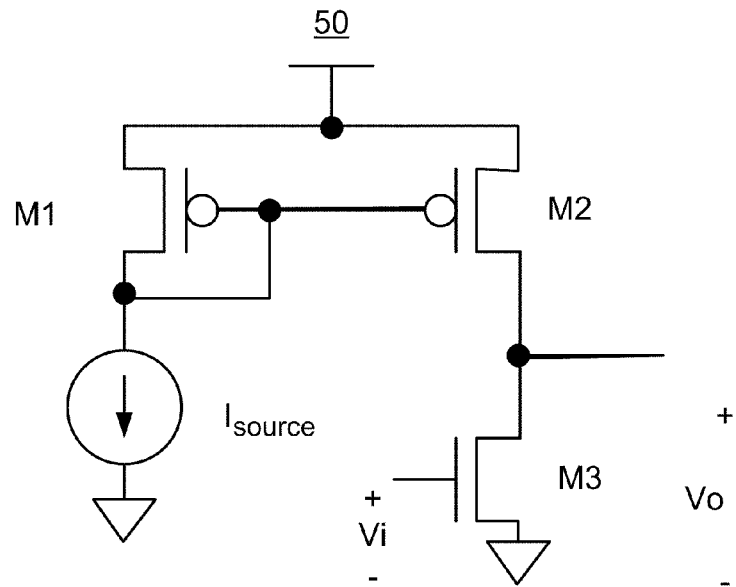
FIG. 3 is a diagram of a portion of a conventional magnetic memory employing the spin transfer effect.
Figure 4:
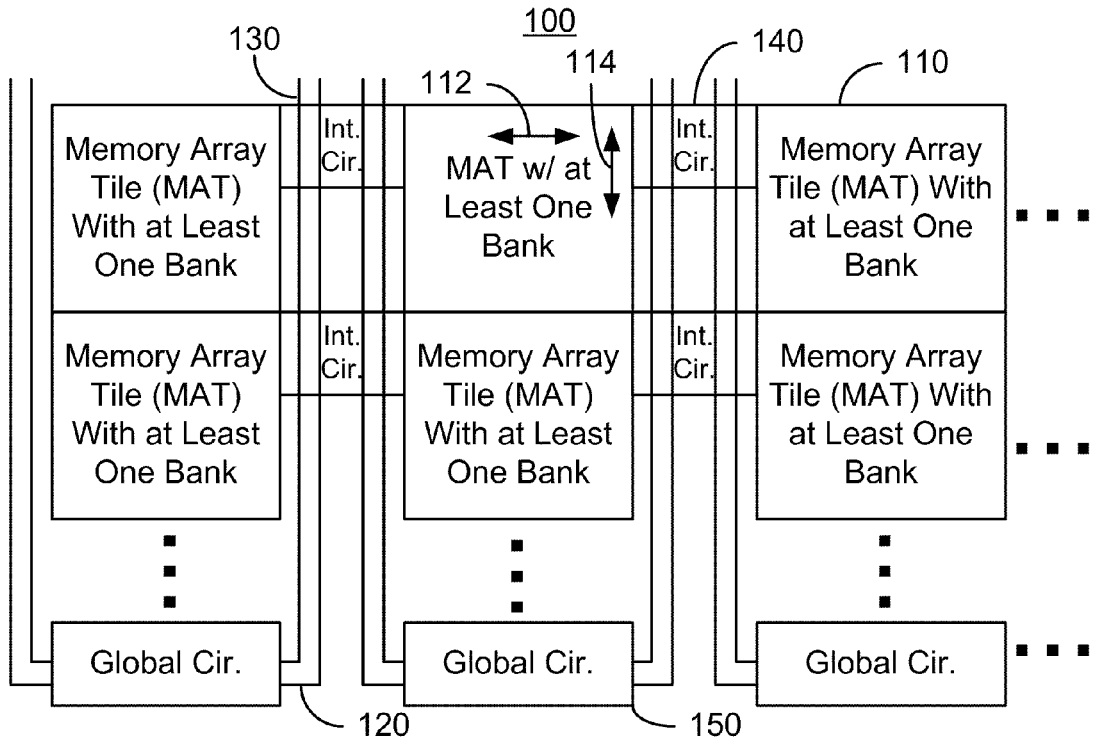
FIG. 4 is a diagram of an exemplary embodiment of a portion of a magnetic memory employing the spin transfer effect.

FIG. 4 is a diagram of an exemplary embodiment of a portion of a magnetic memory 100 employing the spin transfer effect. The magnetic memory 100 is preferably a STT-RAM 100 and is organized in a hierarchical manner. The memory 100 includes memory array tiles (MATs) 110, global circuitry bit lines 120, global write lines 130, intermediate circuitry 140, and global circuitry 150. Although particular numbers of global bit lines 120, global write lines 130, intermediate circuitry 140, and global circuitry 150 are shown, As can be seen in FIG. 4, the combination of MAT 110, global bit lines 120, global write lines 130, intermediate circuitry 140, and global circuitry 150 may be repeated to scale the magnetic memory 100 up to provide storage of a greater amount of data. For example, in the embodiment shown in FIG. 4, the intermediate circuitry 140 controls writing operation(s) in the MAT 110 to its left and/or right.

In the memory 100 depicted, six MATs 110 are shown. However, the memory 100 may include another number of MATs 110. In addition, the memory 100 array may be segregated into sub-arrays. In one embodiment, a sub-array includes eight MATs 110, and nine word lines 112 are sandwiched by local decoding circuitry, such as column select circuits (not explicitly shown), which may be part of the intermediate circuitry 140. The even bit line/source line pairs 114 are connected to column select circuitry at the top intermediate circuitry 140, while the odd bit line/source line pairs 114 pairs are connected to the bottom column select circuitry at the bottom intermediate circuitry 140.

In some embodiments, the memory 100 operates synchronously with an external memory clock. Input control signals may be used to issue read and write commands together with address bits. In some embodiments, eight bits of data may be read or written at the same time. However, other embodiment may read and/or write another number of bits of data. Also in some embodiments, input signals are registered on the positive edge of clock. In some such embodiments, the positive clock cycle is used as memory active cycle and the negative cycle is used as memory pre-charge cycle. As a result, testing and characterization of the MTJ(s) in the storage cells in the MAT(s) 110 might be simplified because the read and write pulse widths may be controlled by the external clock.

The MAT 110 is where data is actually stored. For clarity, only one MAT 110 is labeled with numeral "110". Each MAT includes multiple storage cells (not explicitly shown) that may be arranged in an array. Further, the array may be divided in one or more banks, which may be the same or different. Each storage cell may include one or more magnetic memory elements and one or more selection devices. For example, a memory cell may include one magnetic tunneling junction and one selection transistor. In another embodiment, a storage cell may include two magnetic tunneling junctions and two selection transistors. In other embodiments different numbers of magnetic elements and/or selection devices may be used. The magnetic element is programmable using at write current(s) driven through the magnetic element. In one embodiment, a two transistor-two magnetic element storage cell is formed by combining two one transistor-one magnetic element storage cell. In such an embodiment, one of the two magnetic elements may be assigned the true bit and the other magnetic storage cell assigned the complement bit. Opposite states are written to the true and complement magnetic elements. Such a storage scheme allows for a differential sensing scheme to be used. An embodiment that uses a one transistor-one magnetic element may use a reference bit-line sensing scheme.

The MAT 110 also includes bit lines and word lines. In the embodiment shown, the bit lines and source lines run vertically and are shown by arrows 114, while word lines run horizontally, as shown by arrows 112. The bit lines 114 and the word lines 112 correspond to the magnetic storage cells. In some embodiments, the magnetic storage cells are located cross points of the bit lines 114 and word lines 112. In some embodiments, bit-lines 114 and source-lines 114 may be drawn at half-pitch similar to DRAM.

Figure 5:
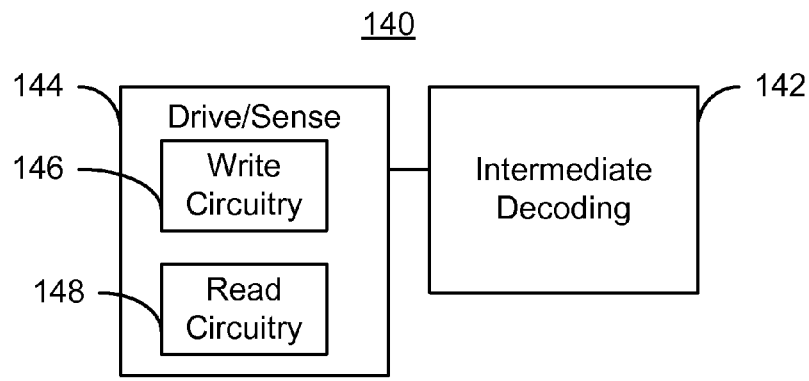
FIG. 5 is a diagram of an exemplary embodiment of the intermediate circuitry.

Intermediate circuitry 140 controls read operations and write operations within the corresponding MATs 110. For example, as shown in FIG. 5, the intermediate circuitry 140 may include local decoding circuitry 142 and drive-sense circuitry 144. Decoding circuitry 142 may allow for selection of specific MAT(s) 110 as well as individual word lines 112 and bit lines 114 (and thus selected storage cells) within the MAT(s) 110. Write circuitry 146 may be used to drive write currents and otherwise control write operations within a MAT 110. Similarly, read circuitry 148 may drive a read current, receive an output sense current from the MAT 110 being read, and/or otherwise control read operations in the corresponding MAT(s) 110.

Referring back to FIG. 4, the global bit lines 120 and global write lines 130 may be used to select between MATs 110. Thus, different MATs 110 may be read or written to based on enabling and disabling of the global bit lines 120 and global write lines 130. The global circuitry 150 is also used for selecting and driving a portion of the global bit lines 120 and a portion of the global write lines 130 for the read operations and the write operations. In other words, the global circuitry may selectively enable/disable portions of the lines 120 and 130 as well as receiving signal(s) from the lines 120.

The memory 100 is organized in a modular, hierarchical architecture. As a result, larger memories may be built by adding one or more of the modules 110, 120, 130, 140, and 150. The memory 100 is thus scalable to larger, more dense memories. For example, the memory 100 might be scalable to gigabit (Gb) densities or beyond. Further, the global bit lines 120 and global write lines 130 may have a lower resistance than the bit lines 114 and word lines 112 within each MAT 110. In some embodiments, this may be achieved by forming the global lines 120 and 130 in the metal 3 layer. Thus, the parasitic resistance may be reduced and/or limited to the MATs 110. Array efficiency may thus be increased with little performance impact. Short write times, for example on the order of ten nanoseconds with a write energy of less than one picoJoule and small read access times, for example of 9.6 ns, might also be achieved in some embodiments. Sense amplifiers may be located in the global circuitry 150 and thus de-coupled from the local bit lines 114. Multiple MATs 110 may also share a set of global sense amplifiers and global writer drivers in the global circuitry 150. In some embodiments, the array size may thus be reduced, for example by 40% over a memory having the same size but using localized sense amplifiers. Use of the intermediate circuitry 140 for sensing signals, driving currents, and decoding within the MATs may reduce read and/or write penalties. Consequently, the memory 100 may be usable in higher density memories, such as high density STT-RAM. Thus, the benefits of STT-RAM, such as lower power consumption, lower cost, and non-volatility may be scaled to higher density memories.

Figure 6:
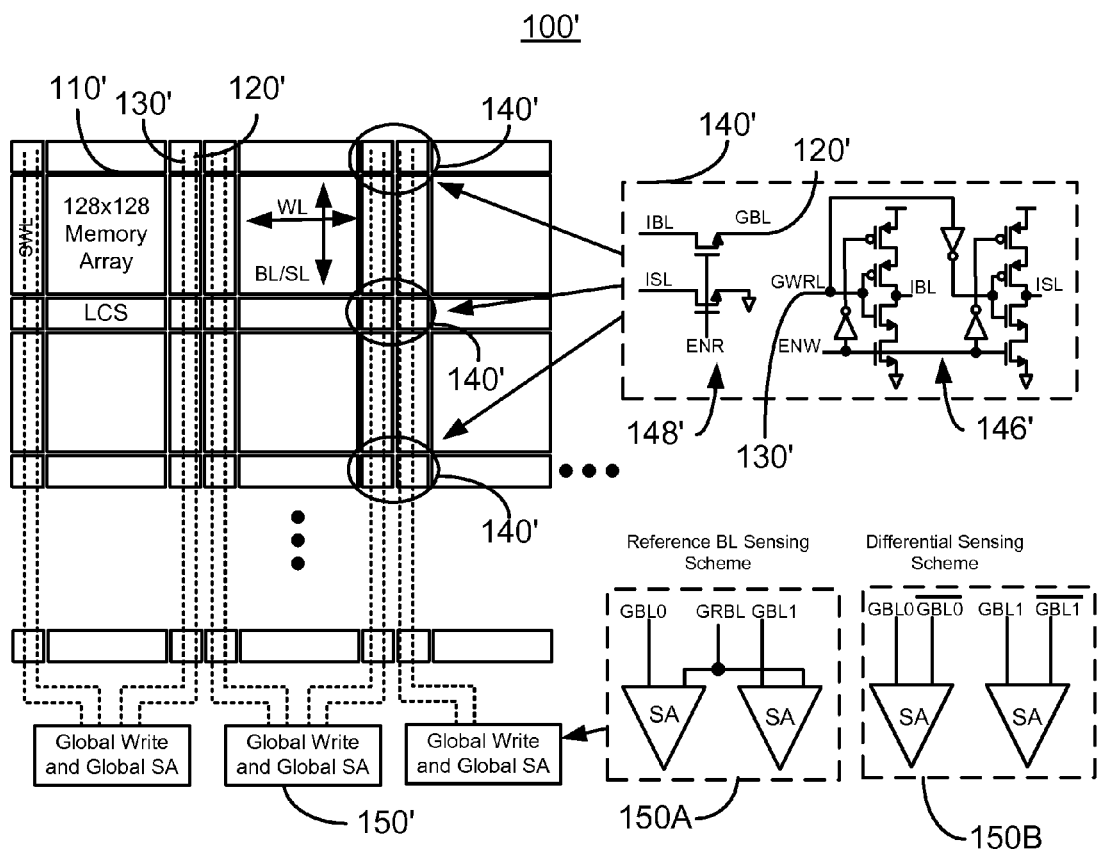
FIG. 6 is a diagram of another exemplary embodiment of a portion of a magnetic memory employing the spin transfer effect.

FIG. 6 is a diagram of another exemplary embodiment of a portion of a magnetic 100' memory employing the spin transfer effect. Many of the components of the magnetic memory 100' are analogous to the magnetic memory 100 and are thus labeled similarly. Consequently, the memory 100' includes MATs 110', global bit lines 120', global write lines 130', intermediate circuitry 140', and global circuitry 150'. Also shown are specific embodiments of the intermediate circuitry 140' and global circuitry 150'. For example, the intermediate circuitry 140' includes read circuitry 148' and write circuitry 146'. Similarly, the global circuitry 150' includes either circuitry 150A configured to sense read signals with respect to a reference signal and circuitry 150B configured to use differential sensing.

The memory 100' includes intermediate circuitry 140'. The intermediate drive/sense circuitry 140' may drive current, receive signals from, and otherwise control read operations and write operations in the corresponding MATs 110', In the embodiment shown, the intermediate circuitry 140' controls such operations for the MAT(s) 110' to the right and/or left of the intermediate circuitry 140'. The intermediate circuitry 140' thus includes read circuitry 148' and write circuitry 146'. The read circuitry 148' controls read operations in the corresponding MAT(s) 110'. In the embodiment shown, the read driver 140' is essentially a pass gate. However, in other embodiments, described below, the read circuitry 148' may include other components. For example, the read circuitry 148' might include a preamplifier or other circuitry. Such a preamplifier may include a current mirror (not shown in FIG. 6).

The write driver 146' is used to drive write current for write operations the corresponding MAT(s) 110. The write driver 146' is tri-stated during read operations. During a write operation, the global write line (GBWL) 130' is activated with valid data and the selected sub-array write drivers 146' are enabled to boost the write data signals on the source and bit lines 114'. The embodiment shown in FIG. 6 has a negative bit line/ source line 114' boost option for increasing the write margin if necessary. A pull down transistor source node of the write driver 146' is connected to a bus which is normally grounded. In the embodiment shown, the word line 112 is boosted to 3.2 v to provide a write current sufficient to write a "1" (change the magnetization of the free layer of a MTJ from antiparallel to the pinned layer magnetization to parallel to the pinned layer magnetization). In one embodiment, this write current is 128 μA. In one embodiment, to write a "0" (change the magnetization of the free layer of a MTJ from parallel to the pinned layer magnetization to antiparallel to the pinned layer magnetization), a write current of approximately 152 μA may be used. In one such embodiment, the MTJ used as the magnetic element is designed to switch at +80 μA, which may provide a write margin greater than 60%. However, other write currents, other magnetic elements switching at different currents, and other schemes might be used. Because the write drivers 146' are repeated locally in the array gap between the MATs 140, there may be little no impact to write margin at higher densities using this architecture.

The memory 100' also includes global circuitry 150'. Global circuitry 150A and 150B that are configured for reference and differential sensing, respectively. For example, the global circuitry 150A may be used in an embodiment in which each storage cell includes a single transistor and a single magnetic element such as an MTJ. The global circuitry 150B may be used for a MAT 110 in which each cell includes two transistors and two magnetic elements and in which a bit and its complement are stored. In addition, the global circuitry 150A and 150B each include sense amplifiers (SA) that are used to provide an output corresponding to the state(s) of the storage cells in the MATs 110.

The memory 100' may share the benefits of the memory 100. The memory 100' is organized in a modular, hierarchical architecture. The memory 100' is thus scalable to larger, more dense memories. For example, the memory 100' might be scalable to Gb densities or beyond. Further, the global bit lines 120' and global write lines 130' may have a lower resistance than the lines 114' and 112' within each MAT 110'. The parasitic resistance may be reduced and/or limited to the MATs 110. Array efficiency may thus be increased with little performance impact. Short write times and small read access times might also be achieved. Sense amplifiers may be located in the global circuitry 150', be de-coupled from the local bit lines, and be shared by multiple MATs 110'. The array size may thus be reduced. Use of the intermediate circuitry 140' may reduce read and/or write penalties. Thus, the benefits of STT-RAM, such as lower power consumption, lower cost, and non-volatility may be scaled to higher density memories.

Figure 7:
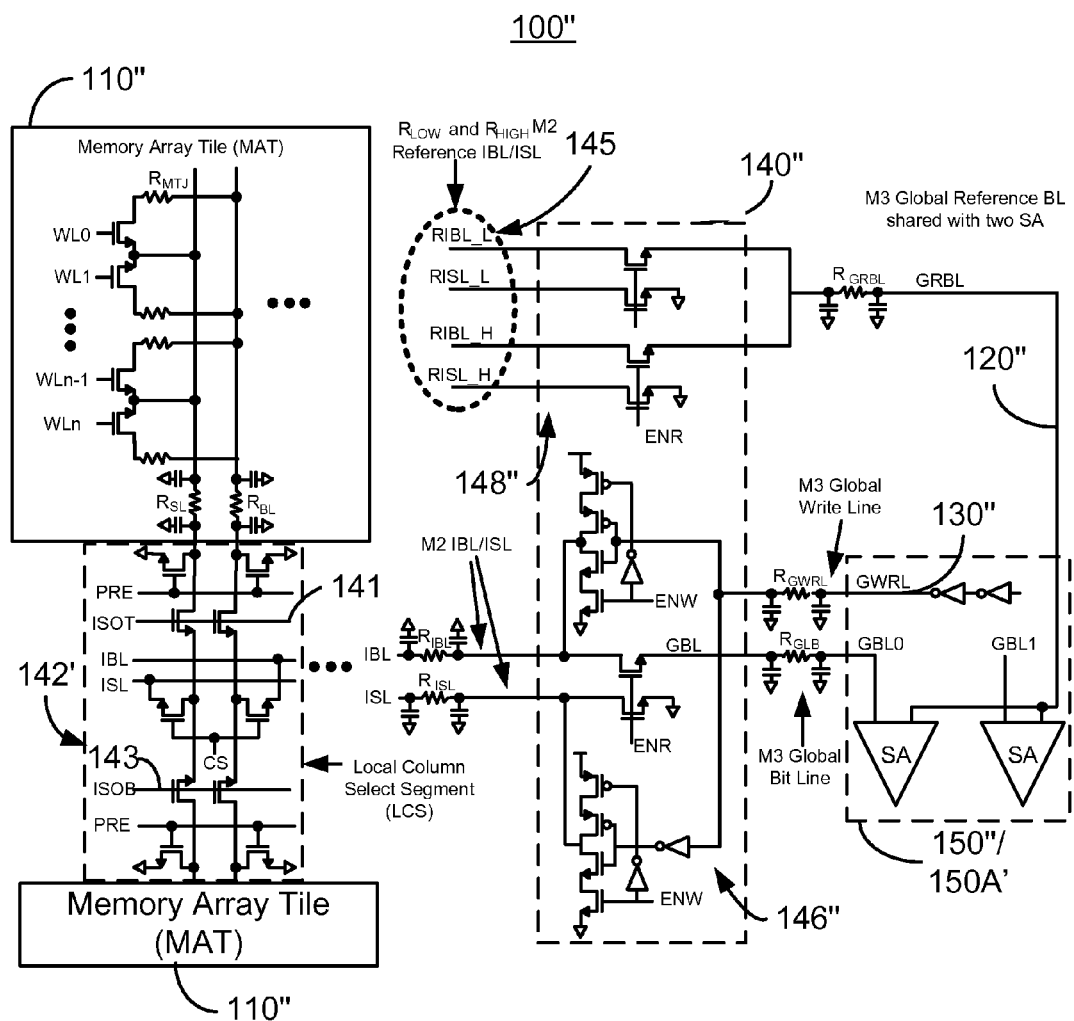
FIG. 7 is a diagram of another exemplary embodiment of a portion of a magnetic memory employing the spin transfer effect.

FIG. 7 is a diagram of another exemplary embodiment of a portion of a magnetic memory 100" employing the spin transfer effect. Many of the components of the magnetic memory 100" are analogous to the magnetic memory 100/100' and are thus labeled similarly. Consequently, the memory 100" includes MATs 110", global bit lines 120", global write lines 130", intermediate circuitry 140", and global circuitry 150". Also shown are specific embodiments of the intermediate circuitry 140" and global circuitry 150". For example, the intermediate circuitry 140" includes write circuitry 146" and read circuitry 148". Similarly, the global circuitry 150" is shown as including circuitry 150A' configured to sense read signals with respect to a reference signal.

The memory 100", like the memories 100 and 100', may be segregated into sub-arrays. In one embodiment, a sub-array includes eight MATs 110" with nine word lines 112 are sandwiched by local decoding circuitry, such as local column select circuits 142', which may be part of the intermediate circuitry 140". The even bit line/source line pairs 114" are connected to column select circuitry at the top intermediate circuitry 140", while the odd bit line/source line pairs 114" pairs are connected to the bottom column select circuitry at the bottom intermediate circuitry 140". The column select signal CS of the local column select circuitry 142' may also be a global signal that may run across multiple MAT(s) 110". Thus, the global circuitry 150" may include a column decoder (not shown) providing the column select signal CS.

In the embodiment shown in FIG. 7, isolation transistors driven by lines 141 and 143. Thus, the MAT 110 being accessed may be selected and the MAT(s) 110 not being accessed may be isolated. In one embodiment, five address bits decode one of 32 global column-select lines, while three bits decode one of eight sections. Each MAT 110 might include 16 Kbit of STT-RAM, four reference bit line/source lines 114", sixteen redundant word lines 112", eight redundant bit line/source lines 114", and four redundant reference bit line/source lines 114". In the embodiment shown, most of the parasitic resistances in the read path are in the bit lines and source lines 114 (not explicitly labeled in FIG. 7), which may be located within metal 1 and metal 0, respectively. These metal layers may be made thin and tight-pitched, resulting in very high resistances compared to the lower resistance intermediate lines 145 and global lines 130"/120". The architecture depicted in FIG. 7 may thus scalable to higher densities because multiple MATs 110 may be added with minor impact to sense amplifier margin. During read and write operations, the magnetic memory 100" operates in an analogous manner to the memories 100 and 100'.

The memory 100" may share the benefits of the memory 100 and 100'. In particular, the memory 100' is organized in a modular, hierarchical architecture. The memory 100" is thus scalable to larger, more dense memories. Further, the global bit lines 120" and global write lines 130" may have a lower resistance. The parasitic resistance may be reduced and/or limited to the MATs 110". Array efficiency may thus be increased with little performance impact. Short write times and small read access times might also be achieved. Sense amplifiers may be located in the global circuitry 150", be de-coupled from the local bit lines, and be shared by multiple MATs 110". The array size may thus be reduced. Use of the intermediate circuitry 140" may reduce read and/or write penalties. Thus, the benefits of STT-RAM, such as lower power consumption, lower cost, and non-volatility may be scaled to higher density memories.

Figure 8:
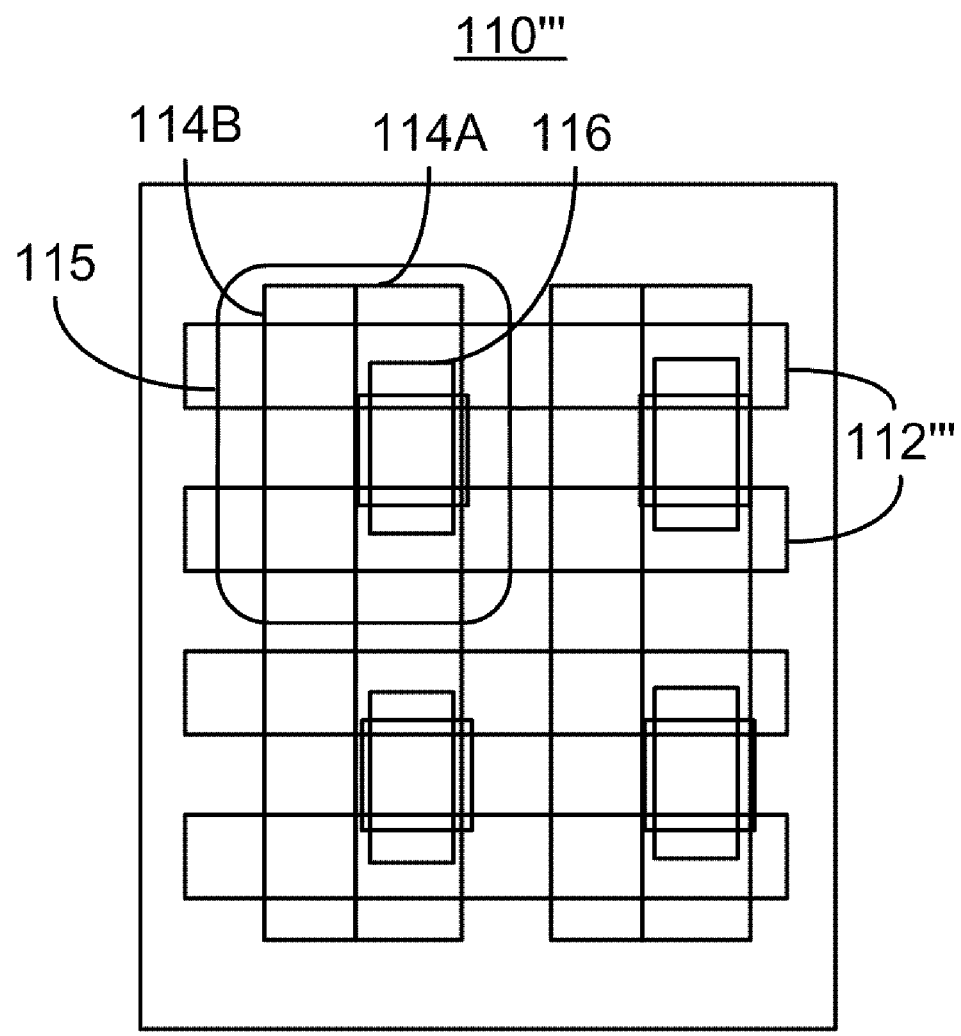
FIG. 8 is a diagram of another exemplary embodiment of a portion of a MAT.

FIG. 8 is a diagram of another exemplary embodiment of a portion of a MAT 110'''. In particular, a storage cell 115 including magnetic element 116 is shown. For clarity, only one storage cell 115 is marked. The storage cell 115 shown includes one magnetic element 116 and one selection device. For clarity, the corresponding selection device is not explicitly labeled. The magnetic element 116 may be a magnetic tunneling junction or other analogous structure that is switchable via spin transfer. The selection device may be a selection transistor. Also shown are bit line 114A, source line 114B. In one embodiment, the memory cell dimension may be 216 nm×188 nm, or 14 $F^2$. In the embodiment shown, two polysilicon word-lines 112''' in parallel make up the gate of the selection transistor The source line 114B may be formed in the metal 0 layer, while the bit line 114A is formed in the metal 1 line. Also in the embodiment shown, the bit line 114A and source line 114B are perpendicular to the word lines 112'''. The word lines 112''' are driven by word line drivers that are part of decoding circuitry 142 (not shown in FIG. 8) and decoded using a hierarchical row decoding scheme. In one embodiment, three address bits decode one of eight word lines 112'''. Thus, eight word lines 112''' are selected at once by a global word-line driver (not shown in FIG. 8) that is part of global circuitry 150. A portion of the remaining address bits select one of the sixteen global write lines 130 within a sub-array section. Remaining bits may be decoded to select one of four sub-array sections in a block. The global write line 130 may reside in the metal 2 that runs across the entire length of the sub-array.

Figure 9:
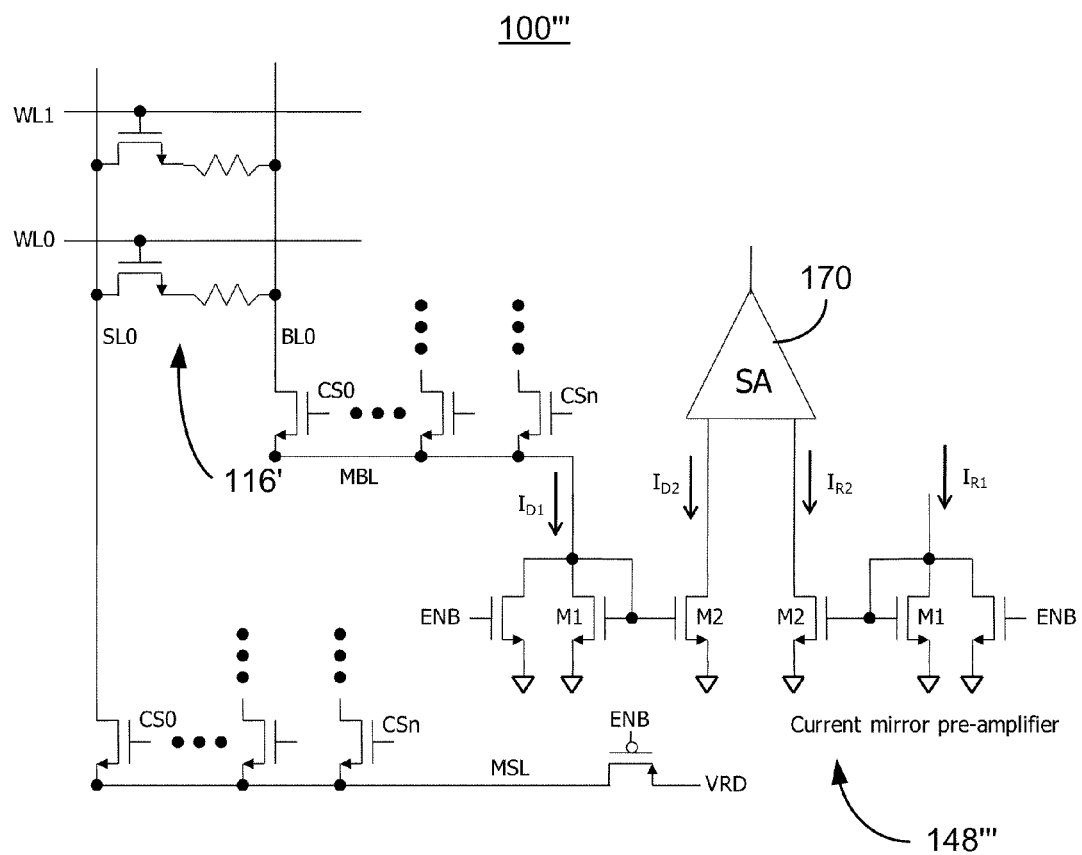
FIG. 9 is a diagram of another exemplary embodiment of a portion of a magnetic memory employing the spin transfer effect including a preamplifier.

FIG. 9 is a diagram of another exemplary embodiment of a portion of a magnetic memory 100''' employing the spin transfer effect including a preamplifier. More specifically, the portion of the magnetic memory 100''' includes read circuitry 148''' that is part of intermediate circuitry such as the intermediate circuitry 140/140'. Also shown are other portions of the memory, including decoding circuitry, for example as shown in the column select transistors receiving column select signals CS0-CSn. As discussed above, the intermediate circuitry 140/140' may include passgate(s) and/or preamplifiers. The read circuitry 148''' includes a preamplifier 148'''. The preamplifier 148''' shown is configured to activate when the enable signal ENB is low. However, in another embodiment, the preamplifier 148''' may be configured in another manner. In the embodiment shown, the preamplifier is a current mirror preamplifier, using transistor pairs M1 and M2 to form the current mirror. In the current mirror, M2 equals N*M1, where N is greater than one. Therefore, the current mirror preamplifier 148 outputs an amplified current that is N times the input read current. Stated differently, the preamplifier 148''' amplifies the read signal from the magnetic elements 116' by a factor of N. Thus, a lower read current may be used within the MATs 110/110'. More specifically, the transistors M1 may have a width designed to provide a small read current that is well under the switching current of the magnetic element(s) of the storage cell. Thus, a read operation may be performed without disturbing the state of the storage cells in the MAT(s) 110/110'/110". In addition, power dissipation by read current carried by higher resistance bit and source lines 114 may be reduced. Using M2 transistors having widths designed to provide sufficient amplification allows for a higher output current. Thus, more robust sensing is achieved. Note that sense amp current path is decoupled from the current path of the magnetic element. The preamplifier 148''' thus amplifies the read current from the MAT(s) 110/110' and may drive the current to global circuitry 150/150'. More specifically, in the embodiment shown, the amplified current may be provided to sense amplifier 170 that may be part of the global circuitry 150/150'.

The magnetic memory 100''' may share the benefits of the memories 100, 100', and 100". In addition, because of the use of the preamplifier 148''', there may be little or no read penalty. More specifically, as discussed above, a lower read current may be used within the MATs 110/110'/110", amplified by the preamplifier 148''', and the amplified current may be provided to the sense amplifier 170 for determination of the state of the storage cell being read. Consequently, performance may be improved.

Figure 10:
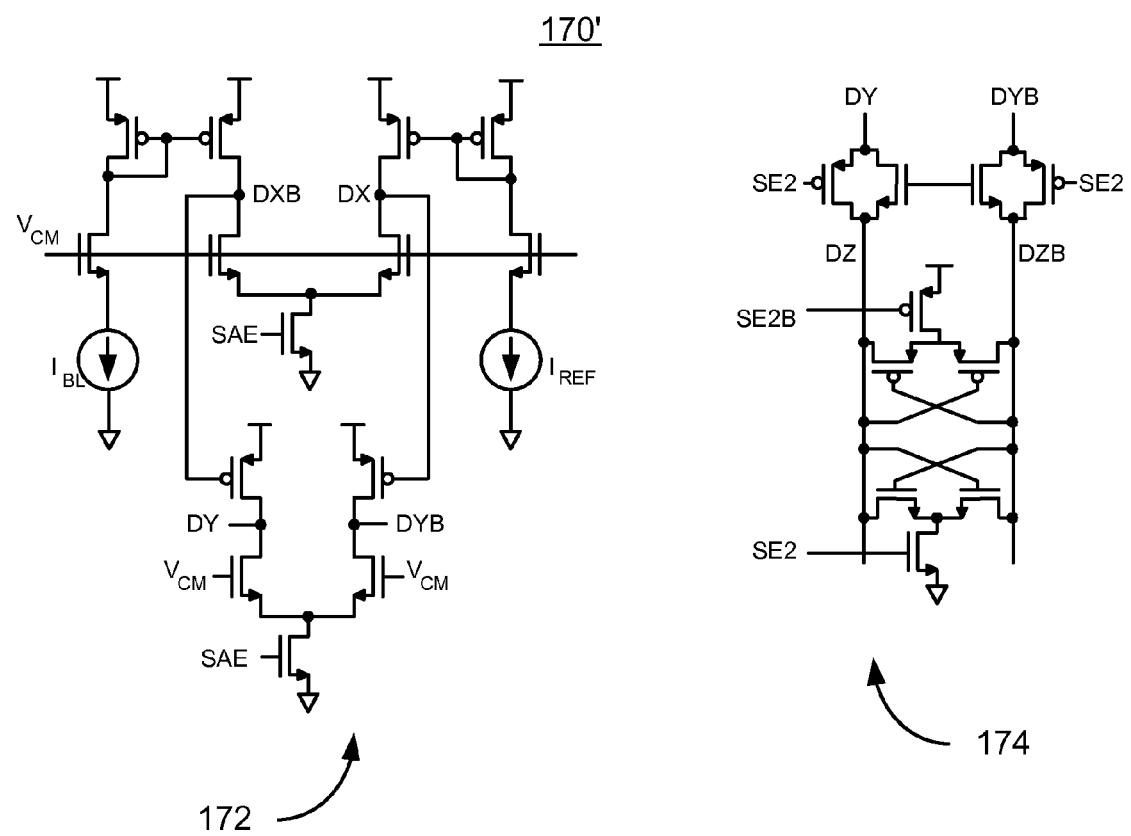
FIG. 10 is a diagram of an exemplary embodiment of a stage of a sense amplifier usable in a memory employing the spin transfer effect.

FIG. 10 is a diagram of an exemplary embodiment of the stages of a sense amplifier 170' usable in a memory, such as the memory 100/100'/100"/100''' employing the spin transfer effect. Thus, the sense amplifier 170' may be used in global circuitry 150/150'/150". The sense amplifier 170' may include stages 172 and 174. The first stage 172 may be a current stage. The first stage 172 may be repeated as a first voltage stage. In such an embodiment, therefore, the first stage 172 may be used for two of three stages of the sense amplifier 170'. The second stage 174 may be a second voltage stage. In another embodiment, the sense amplifier 170' includes two stages. However, in another embodiment, the sense amplifier 170' may include another number of stages. Further, in another embodiment, the memory 100/100'/100"/100''' may use another sense amplifier (not shown).

In the embodiment shown, the bit line 120 that carry data and, in some embodiments, a reference act as the current source loads to a pair of common source amplifiers. The signal $V_{CM}$ is a bias voltage that controls the current source as well as the output voltage. However, control of the current source and the output voltage may be separated for independent control. In addition, in the embodiment shown, $I_{BL}$ is the current provided for read operations. Thus, the sense amplifier 170' may provide the read current and receive a read current as a load. However, in another embodiment, the read current may be decoupled from the sense amplifier 170'. The circuit 172 used in the first current and first voltage stages (the first two stages of the sense amplifier 170') are powered using which is less than the power supply voltage. The combination of $V_{CM}$ and the voltage powering the circuit 172 results in a controlled read voltage across the magnetic element 116. The sense amplifier 170' may be used in the reference scheme (e.g. one transistor-one magnetic element per storage cell) as well as in a differential sensing scheme (two transistors and two magnetic elements storing complementary data per storage cell). Note that the sensing margin may be doubled with the differential sensing scheme.

Figure 11:
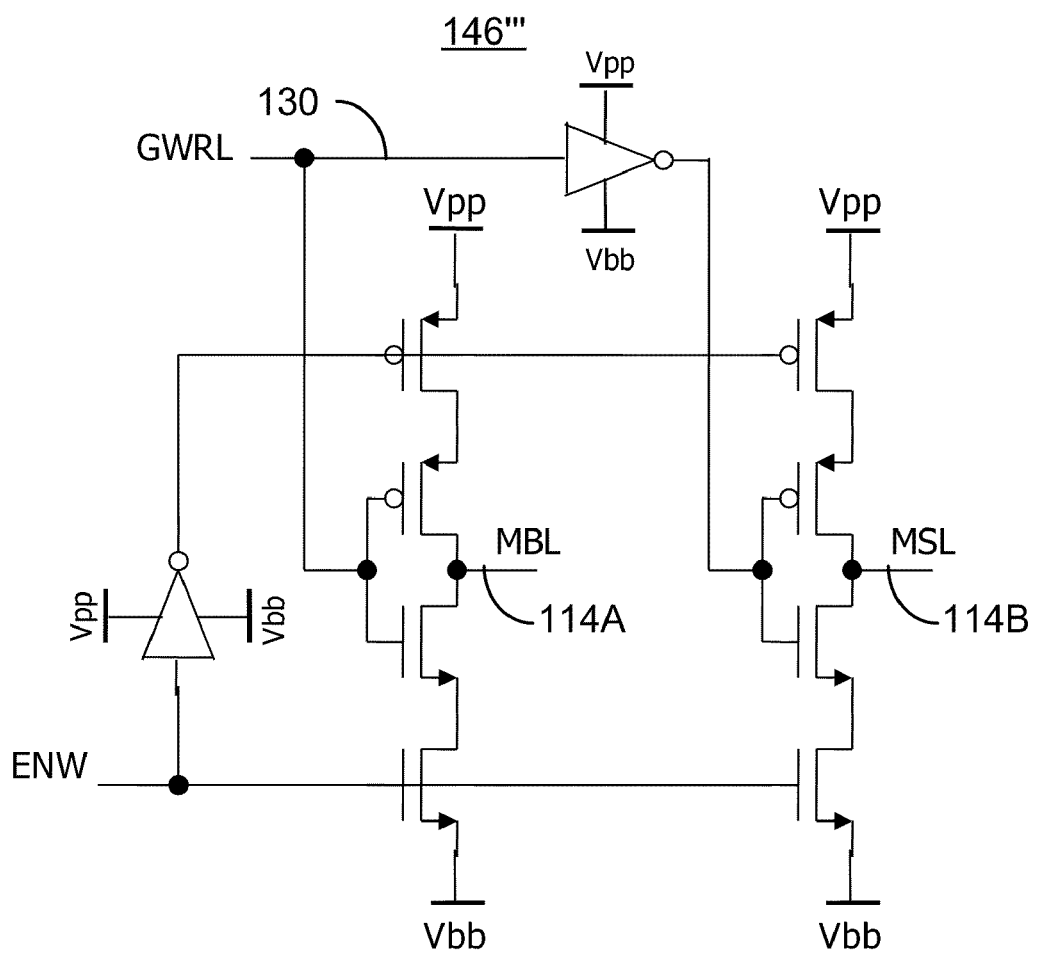
FIG. 11 is a diagram of another exemplary embodiment of a write driver usable in a memory employing the spin transfer effect.

FIG. 11 is a diagram of another exemplary embodiment of a write driver 146''' usable in a memory employing the spin transfer effect. The write driver is analogous to the write driver 146" depicted in FIG. 7. In operation, global circuitry 150/150' (not shown in FIG. 11). When writing a "1", global circuitry 150/150' drives GWRL high. As a result, the bit line 114A is high, while the source line 114B is driven low. Thus, the write driver 146''' may also drive write current(s) in the MAT(s) 110/110'/110"/110'''. Thus, use of the write driver 146''' in the intermediate circuitry 140/140'/140" of the memory 100, 100', 100", 100''' may allow for at least some of the benefits of the intermediate circuitry 140/140'/140" to be achieved.

Figure 12:
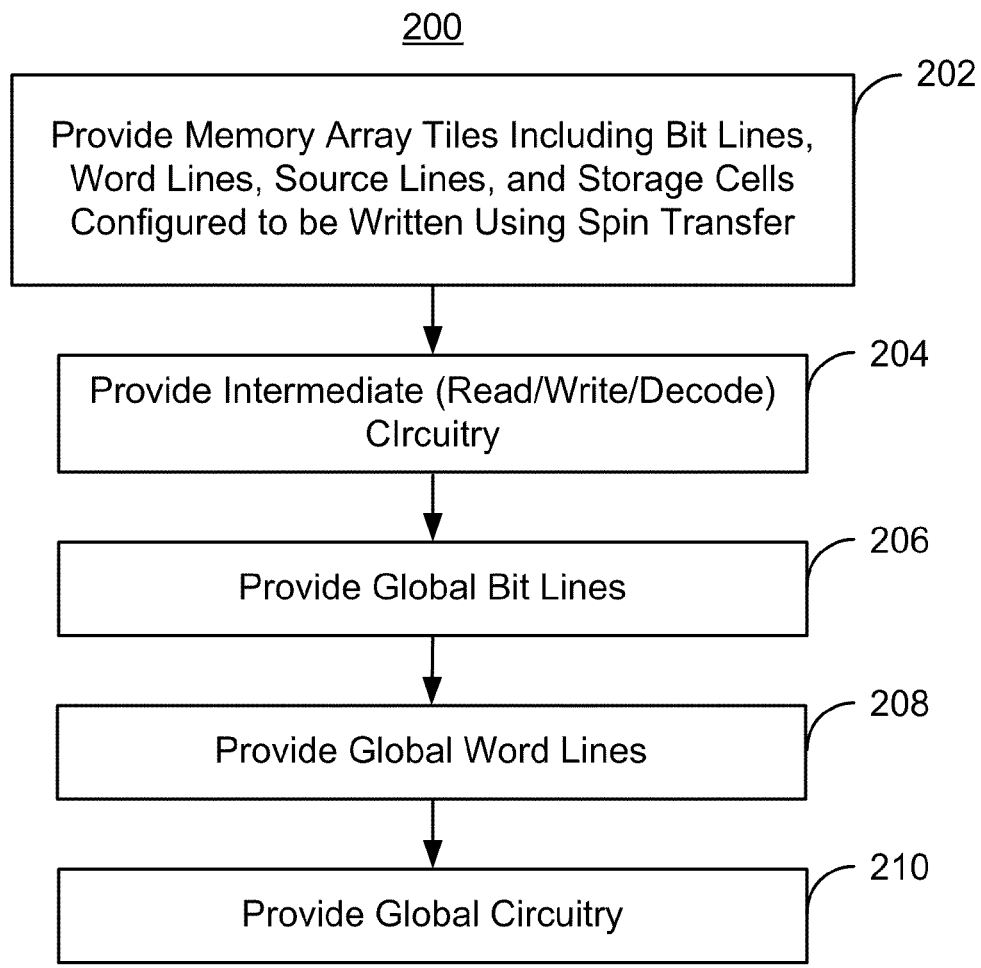
FIG. 12 is a diagram of an exemplary embodiment of a method for providing a magnetic memory employing the spin transfer effect.

FIG. 12 is a diagram of an exemplary embodiment of a method 200 for providing a magnetic memory employing the spin transfer effect. For clarity, the method 200 is described in context of the memory 100 in FIG. 4. However, in alternate embodiments, other configurations may be used. In addition, the method 200 is described in the context of particular steps. However, steps may be combined or omitted.

A plurality of MATs 110 are provided, via step 202. Thus, step 202 includes providing one or more arrays, each of which includes multiple magnetic storage cells. Further, bit and source lines 114, plurality of word lines 112, within the MATs are provided. Intermediate circuitry 140 for controlling read operations and write operations within the plurality of MATs are provided, via step 204. Step 204 may include providing decoding circuitry 142, and read/write circuitry 144 that may include write driver(s) 146 and read drivers 148. Global bit lines 120 are provided, via step 206. Similarly, global write lines 130 are provided, via step 208. Global circuitry 150 is also provided, via step 210. Fabrication of the memory 100 may then be completed.

Using the method 200, the memory 100, 100', 100", and/or 100''' may be provided. Consequently, the benefits of the hierarchical architecture of the memories 100, 100' might be achieved.

A method and system for a magnetic memory has been disclosed. The method and system has been described in accordance with the embodiments shown, and there could be variations to the embodiments, and any variations would be within the spirit and scope of the present invention. Accordingly, many modifications may be made by one of ordinary skill in the art without departing from the spirit and scope of the appended claims.

I claim:

1. A magnetic memory comprising:
   a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
   intermediate circuitry for controlling read operations and write operations within the plurality of MATs;
   a plurality of global bit lines, each of the global bit lines corresponding to a first portion of the plurality of MATs;
   a plurality of global write lines, each of the global write lines corresponding to a second portion of the plurality of MATs; and
   global circuitry for selecting and driving a portion of the plurality of global bit lines and a portion of the plurality of global write lines for the read operations and the write operations;
   wherein the intermediate circuitry further includes a plurality of intermediate drive/sense circuitry and local decoding circuitry, the plurality of intermediate driver/ sense circuitry for driving at least one of read operations and write operations in the plurality of MATs, each of the plurality of intermediate drive/sense circuitry corresponding to a third portion of the plurality of MATs, the local decoding circuitry for selecting at least one selected MAT of the plurality of MATs and at least one of the storage cells in the at least one selected MAT.

2. A magnetic memory comprising:
a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
intermediate circuitry for controlling read operations and write operations within the plurality of MATs;
a plurality of global bit lines, each of the global bit lines corresponding to a first portion of the plurality of MATs;
a plurality of global write lines, each of the global write lines corresponding to a second portion of the plurality of MATs; and
global circuitry for selecting and driving a portion of the plurality of global bit lines and a portion of the plurality of global write lines for the read operations and the write operations;
wherein the intermediate circuitry further includes a plurality of intermediate read drivers and a plurality of intermediate write drivers, each of the plurality of intermediate read drivers for controlling read operations in a third portion of the plurality of MATs, each of the plurality of write drivers for driving the write operations in a fourth portion of the plurality of MATs.

3. The magnetic memory of claim 2 wherein each the intermediate read drivers further includes:
at least one preamplifier for amplifying a read signal from the portion of the plurality of MATs to provide an amplified read signal.

4. The magnetic memory of claim 3 wherein the at least one preamplifier further includes:
at least one current mirror preamplifier.

5. The magnetic memory of claim 3 wherein the global circuitry further includes:
at least one sense amplifier for receiving an amplified read signal from the preamplifier and providing an output corresponding to at least one state of at least one of the plurality of storage cells in the portion of the plurality of MATs.

6. The magnetic memory of claim 5 wherein the at least one sense amplifier further includes:
a first current stage; and
a voltage stage coupled with the first current stage.

7. The magnetic memory of claim 5 wherein the at least one sense amplifier further includes:
a first current stage;
a first voltage stage coupled with the first current stage; and
a second voltage stage coupled with the first voltage stage.

8. The magnetic memory of claim 2 wherein each of the plurality of read drivers further includes:
a passgate corresponding to the third portion of the MATs.

9. A magnetic memory comprising:
a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
intermediate circuitry for controlling read operations and write operations within the plurality of MATs;
a plurality of global bit lines, each of the global bit lines corresponding to a first portion of the plurality of MATs;
a plurality of global write lines, each of the global write lines corresponding to a second portion of the plurality of MATs; and
global circuitry for selecting and driving a portion of the plurality of global bit lines and a portion of the plurality of global write lines for the read operations and the write operations;
wherein the plurality of global write lines has a first resistance, the plurality of global bit lines has a second resistance, the plurality of word lines has a third resistance, and the plurality of bit lines has a fourth resistance, the first resistance being less than the third resistance and the fourth resistance, the second resistance being less than the third resistance and the fourth resistance.

10. The magnetic memory of claim 1 wherein the global circuitry further includes:
at least one sense amplifier for receiving a read signal from the portion of the plurality of MATS and is configured to process the read signal in a differential sensing scheme.

11. The magnetic memory of claim 1 wherein the global circuitry further includes:
at least one sense amplifier for receiving a read signal from the portion of the plurality of MATS and is configured to process the read signal in based on a reference signal.

12. The magnetic memory of claim 1 wherein the plurality of MATs further includes:
a first bank; and
a second bank different from the first bank.

13. The magnetic memory of claim 1 wherein at least a portion of the plurality of storage cells includes a single transistor and a single magnetic element.

14. A magnetic memory comprising:
a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
intermediate circuitry for controlling read operations and write operations within the plurality of MATs;
a plurality of global bit lines, each of the global bit lines corresponding to a first portion of the plurality of MATs;
a plurality of global write lines, each of the global write lines corresponding to a second portion of the plurality of MATs; and
global circuitry for selecting and driving a portion of the plurality of global bit lines and a portion of the plurality of global write lines for the read operations and the write operations
wherein at least a portion of the plurality of storage cells includes two transistors and two magnetic elements.

15. The magnetic memory of claim 14 wherein the two transistors and two magnetic elements are configured to be read in a differential sensing scheme.

16. A magnetic memory comprising:
a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
intermediate circuitry for controlling read operations and write operations within the plurality of MATs, the intermediate circuitry further including at least one current mirrored preamplifier for amplifying a read signal from the portion of the plurality of MATs to provide an amplified read signal;
a plurality of intermediate read drivers, each of the plurality of intermediate read drivers for controlling read operations in a third portion of the plurality of MATs, the intermediate read drivers further including;
a plurality of intermediate write drivers, each of the plurality of write drivers for driving the write operations in a fourth portion of the plurality of MATs local decoding circuitry for selecting at least one selected MAT of the plurality of MATs and at least one of the storage cells in the at least one selected MAT; and
a plurality of global bit lines, each of the global bit lines corresponding to a first portion of the plurality of MATs; and
a plurality of global write lines, each of the global write lines corresponding to a second portion of the plurality of MATs;
global circuitry for selecting and driving a portion of the plurality of global bit lines and a portion of the plurality of global write lines for the read operations and the write operations, the global circuitry including at least one sense amplifier for receiving an amplified read signal from the preamplifier and providing an output corresponding to at least one state of at least one of the plurality of storage cells in the portion of the plurality of MATs.

17. A method for providing magnetic memory comprising:
providing a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
providing intermediate circuitry for controlling read operations and write operations within the plurality of MATs;
providing a plurality of global bit lines, each of the global bit lines corresponding to a first portion of the plurality of MATs;
providing a plurality of global write lines, each of the global write lines corresponding to a second portion of the plurality of MATs; and
providing global circuitry for selecting and driving a portion of the plurality of global bit lines and a portion of the plurality of global write lines for the read operations and the write operations;
wherein the step of providing the intermediate circuitry further includes
providing a plurality of intermediate drive/sense circuitry for driving at least one of read operations and write operations in the plurality of MATs, each of the plurality of intermediate drivers corresponding to a third portion of the plurality of MATs; and
providing local decoding circuitry for selecting at least one selected MAT of the plurality of MATs and at least one of the storage cells in the at least one selected MAT.

18. A method for providing magnetic memory comprising:
providing a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
providing intermediate circuitry for controlling read operations and write operations within the plurality of MATs;
providing a plurality of global bit lines, each of the global bit lines corresponding to a first portion of the plurality of MATs;
providing a plurality of global write lines, each of the global write lines corresponding to a second portion of the plurality of MATs; and
providing global circuitry for selecting and driving a portion of the plurality of global bit lines and a portion of the plurality of global write lines for the read operations and the write operations;
wherein the step of providing the intermediate circuitry further includes
providing a plurality of intermediate read drivers, each of the plurality of intermediate read drivers for controlling read operations in a third portion of the plurality of MATs; and
a plurality of intermediate write drivers, each of the plurality of write drivers for driving the write operations in a fourth portion of the plurality of MATs.

19. A method for providing magnetic memory comprising:
providing a plurality of memory array tiles (MATs), each of the plurality of MATs including a plurality of magnetic storage cells, a plurality of bit lines having a first resistance, and a plurality of word lines having a second resistance, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells;
providing intermediate circuitry for controlling read operations and write operations within the plurality of MATs;
providing a plurality of global bit lines having a third resistance less than the first resistance of the bit lines, each of the global bit lines corresponding to a first portion of the plurality of MATs;

providing a plurality of global write lines having a fourth resistance less than the second resistance, each of the global write lines corresponding to a second portion of the plurality of MATs; and providing global circuitry for selecting and driving a portion of the plurality of global bit lines and a portion of the plurality of global write lines for the read operations and the write operations.

20. A method for providing magnetic memory comprising:

providing a plurality of memory array tiles (MATs), each of the plurality of MATs including a plurality of magnetic storage cells, a plurality of bit lines, and a plurality of word lines, each of the plurality of magnetic storage cells including at least one magnetic element and at least one selection device, the at least one magnetic element being programmable using at least one write current driven through the at least one magnetic element, the plurality of bit lines and the plurality of word lines corresponding to the plurality of magnetic storage cells, at least a portion of the plurality of storage cells including two transistors and two magnetic elements;

providing intermediate circuitry for controlling read operations and write operations within the plurality of MATs;

providing a plurality of global bit lines, each of the global bit lines corresponding to a first portion of the plurality of MATs;

providing a plurality of global write lines, each of the global write lines corresponding to a second portion of the plurality of MATs; and providing global circuitry for selecting and driving a portion of the plurality of global bit lines and a portion of the plurality of global write lines for the read operations and the write operations.

* * * * *